United States Patent
Park et al.

(10) Patent No.: US 9,324,407 B2
(45) Date of Patent: Apr. 26, 2016

(54) SEMICONDUCTOR APPARATUS CAPABLE OF PREVENTING REFRESH ERROR AND MEMORY SYSTEM USING THE SAME

(71) Applicant: SK hynix Inc., Icheon-si Gyeonggi-do (KR)

(72) Inventors: Min Su Park, Icheon-si (KR); Young Jun Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/453,190

(22) Filed: Aug. 6, 2014

(65) Prior Publication Data

US 2015/0325284 A1    Nov. 12, 2015

(30) Foreign Application Priority Data

May 8, 2014    (KR) .................. 10-2014-0054885

(51) Int. Cl.
*G11C 7/00* (2006.01)
*G11C 11/406* (2006.01)
*G11C 11/408* (2006.01)
*G11C 29/02* (2006.01)
*G11C 11/4076* (2006.01)
*G11C 11/4074* (2006.01)
*G11C 8/18* (2006.01)

(52) U.S. Cl.
CPC ........ *G11C 11/40618* (2013.01); *G11C 11/406* (2013.01); *G11C 11/408* (2013.01); *G11C 11/4074* (2013.01); *G11C 11/4076* (2013.01); *G11C 29/02* (2013.01); *G11C 8/18* (2013.01)

(58) Field of Classification Search
CPC ............. G11C 11/406; G11C 11/4076; G11C 11/4074; G11C 29/02; G11C 8/18
USPC ................................ 365/222, 230.03, 189.07
See application file for complete search history.

(56) References Cited

U.S. PATENT DOCUMENTS

| 5,627,791 | A  | * | 5/1997 | Wright et al. ............... 365/222 |
| 5,796,669 | A  | * | 8/1998 | Araki et al. ................. 365/222 |
| 7,079,440 | B2 | * | 7/2006 | Remaklus et al. ........... 365/222 |
| 7,177,220 | B2 | * | 2/2007 | Chou et al. .................. 365/222 |
| 8,498,167 | B1 | * | 7/2013 | Huang ..................... 365/189.07 |

FOREIGN PATENT DOCUMENTS

KR    1020150052967 A    5/2015

* cited by examiner

*Primary Examiner* — Pho M Luu
(74) *Attorney, Agent, or Firm* — William Park & Associates Ltd.

(57) ABSTRACT

A semiconductor apparatus includes a plurality of memory banks configured to perform a refresh operation in response to an address count value and row active signals; a refresh control block configured to update refresh bank informations which define a bank designated to perform the refresh operation in response to a refresh command and bank addresses, and activate a count control signal in response to the refresh bank informations; and a counter configured to change the address count value in response to activation of the count control signal.

33 Claims, 7 Drawing Sheets

FIG.5

| RA | RA<0> | RA<1> | RA<2> | RA<3> | RA<4> | RA<5> | RA<6> | RA<7> | All High Or All Low |
|---|---|---|---|---|---|---|---|---|---|
| Refresh Bank | BK0 | BK1 | BK2 | BK3 | BK4 | BK5 | BK6 | BK7 | All BK |

SEMICONDUCTOR APPARATUS CAPABLE OF PREVENTING REFRESH ERROR AND MEMORY SYSTEM USING THE SAME

CROSS-REFERENCES TO RELATED APPLICATION

The present application claims priority under 35 U.S.C. §119(a) to Korean application number 10-2014-0054885, filed on May 8, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus capable of preventing a refresh error and a memory system using the same.

2. Related Art

A semiconductor apparatus may include a plurality of memory blocks, for example, a plurality of memory banks (hereinafter, simply referred to as 'banks').

The semiconductor apparatus may perform a refresh operation for the plurality of banks, according to the control of an external device, for example, a memory controller (for example, a CPU, GPU, or the like).

The controller provides an all bank refresh command for performing the refresh operation for all of the plurality of banks or a single bank refresh command for performing the refresh operation for any one of the plurality of banks, to the semiconductor apparatus.

SUMMARY

In an embodiment, a semiconductor apparatus may include a plurality of memory banks configured to perform a refresh operation in response to an address count value and row active signals. The semiconductor apparatus may also include a refresh control block configured to update refresh bank informations which define a bank designated to perform the refresh operation in response to a refresh command and bank addresses, and activate a count control signal in response to the refresh bank informations. Further, the semiconductor apparatus may also include a counter configured to change the address count value in response to activation of the count control signal.

In an embodiment, a memory system may include a memory controller configured to provide row addresses as an information which defines a bank to refresh, and provide a refresh command along with the row addresses. In addition, the memory system may include a semiconductor apparatus configured to perform a refresh operation for at least one memory bank which corresponds to the row addresses and is designated to perform the refresh operation in response to the refresh command.

In an embodiment, a memory system may include a memory controller configured to provide row addresses as an information which defines a bank to refresh, and provide a refresh command along with the row addresses. The memory system may also include a semiconductor apparatus configured to perform a refresh operation for at least one memory bank which corresponds to the row addresses to perform the refresh operation, in response to the refresh command, and change an address count value for designating a word line to be refreshed, when refresh designation for a the plurality of memory banks is completed.

In an embodiment, a memory system may include a memory controller configured to provide row addresses as an information which defines a bank to refresh, and provide a refresh command along with the row addresses. The memory system may also include a semiconductor apparatus configured to perform a refresh operation for at least one memory bank which corresponds to the row addresses to perform the refresh operation, in response to the refresh command, wherein the one or more memory banks independently increase address count values for banks and perform the refresh operation for word lines corresponding to the address count values for banks.

BRIEF DESCRIPTION OF THE DRAWINGS

FIG. 5 is a block diagram showing the internal configuration of the refresh control block shown in FIG. 3.

DETAILED DESCRIPTION

A semiconductor apparatus capable of preventing a refresh error and a memory system using the same will be described below with reference to the accompanying drawings through various embodiments. A controller may cause a refresh operation to be performed for all of a plurality of banks, by providing the single bank refresh command a plurality of times. In the course of providing the single bank refresh command the plurality of times, the controller should also provide addresses for selecting corresponding banks, that is, bank addresses, in conformity with predetermined order. However, in the case where a wrong bank address is provided due to an operation error, a communication error or the like, of the controller, the refresh operation for a corresponding bank cannot help but be skipped, and as a result, damage to stored data is likely to be caused. A semiconductor apparatus which can prevent a refresh error to allow a refresh operation to be stably and freely performed for a plurality of banks and a memory system using the same are described herein.

Figure 1:
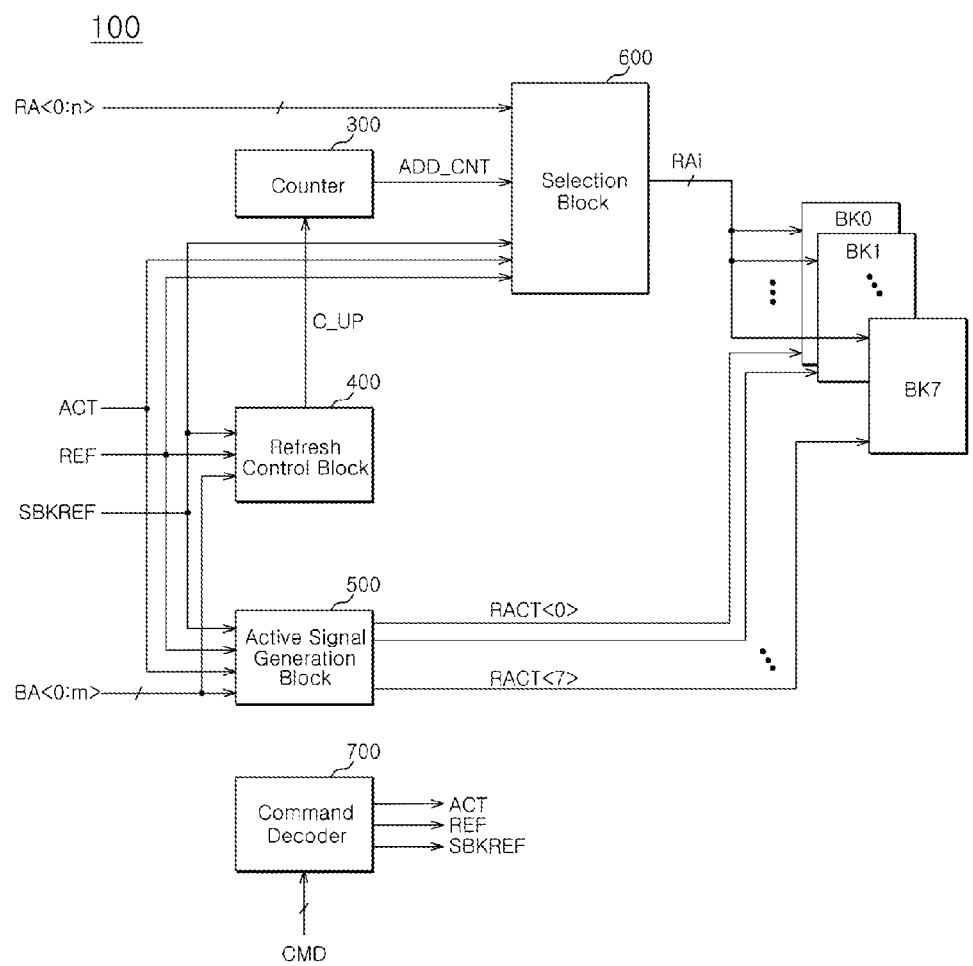
FIG. 1 is a block diagram of a semiconductor apparatus capable of preventing a refresh error in accordance with an embodiment.

Referring to FIG. 1, a semiconductor apparatus 100 may include a plurality of memory banks (hereinafter, simply referred to as 'banks') BK0 to BK7, a counter 300, a refresh control block 400, an active signal generation block 500, a selection block 600, and a command decoder 700.

The plurality of banks BK0 to BK7 may be configured to perform a refresh operation for the memory cells electrically coupled with a specified word line of a selected bank BKi (i is one of 0 to n), in response to row active signals RACT<0:7> and internal row addresses RAi.

In the plurality of banks BK0 to BK7, a specified word line may be selected in response to the internal row addresses RAi.

In the plurality of banks BK0 to BK7, a specified word line of one bank corresponding to a signal bit activated among the row active signals RACT<0:7> or specified word lines of all the banks BK0 to BK7 may be activated.

The counter 300 may be configured to increase an internal address count value ADD_CNT in response to a count control signal C_UP.

The refresh control block 400 may be configured to detect that designation of the refresh operation for when all of the plurality of banks BK0 to BK7 is completed, in response to a single bank refresh command SBKREF and bank addresses BA<0:m>. The refresh control block 400 may also activate the count control signal C_UP.

The refresh control block 400 may be configured to store the information of a bank completely refreshed among the plurality of banks BK0 to BK7, in response to the single bank refresh command SBKREF and the bank addresses BA<0:m>. The refresh control block 400 may also detect that designation of the refresh operation for when all of the plurality of banks BK0 to BK7 is completed, based on stored informations, and activate the count control signal C_UP.

The refresh control block 400 may be configured to activate the count control signal C_UP regardless of the bank addresses BA<0:m>, in response to an all bank refresh command REF.

The active signal generation block 500 may be configured to generate the row active signals RACT<0:7> according to an active command ACT, the single bank refresh command SBKREF, the all bank refresh command REF and the bank addresses BA<0:m>.

The active signal generation block 500 may be configured to generate the row active signals RACT<0:7> to activate a bank corresponding to the bank addresses BA<0:m>, when the active command ACT is inputted.

The active signal generation block 500 may be configured to generate the row active signals RACT<0:7> to activate a bank corresponding to the bank addresses BA<0:m>, when the single bank refresh command SBKREF is inputted.

For example, if the active command ACT or the single bank refresh command SBKREF is inputted and the bank addresses BA<0:m> have values to designate the bank BK0, the active signal generation block 500 may output only the row active signal RACT<0> to a logic high.

If the all bank refresh command REF is inputted, the active signal generation block 500 may output all the row active signals RACT<0:7> to the logic high, regardless of the bank addresses BA<0:m>.

The selection block 600 may be configured to select the address count value ADD_CNT in response to the single bank refresh command SBKREF or the all bank refresh command REF. The selection block 600 may also output the internal row addresses RAi.

The selection block 600 may be configured to select row addresses RA<0:n> in response to the active command ACT, and output the internal row addresses RAi.

The command decoder 700 may be configured to decode commands CMD provided from a memory controller outside the semiconductor apparatus 100. The command decoder 700 may also generate the active command ACT, the single bank refresh command SBKREF and the all bank refresh command REF.

The row addresses RA<0:n> and the bank addresses BA<0:m> may be provided from the memory controller outside the semiconductor apparatus 100.

Figure 2:
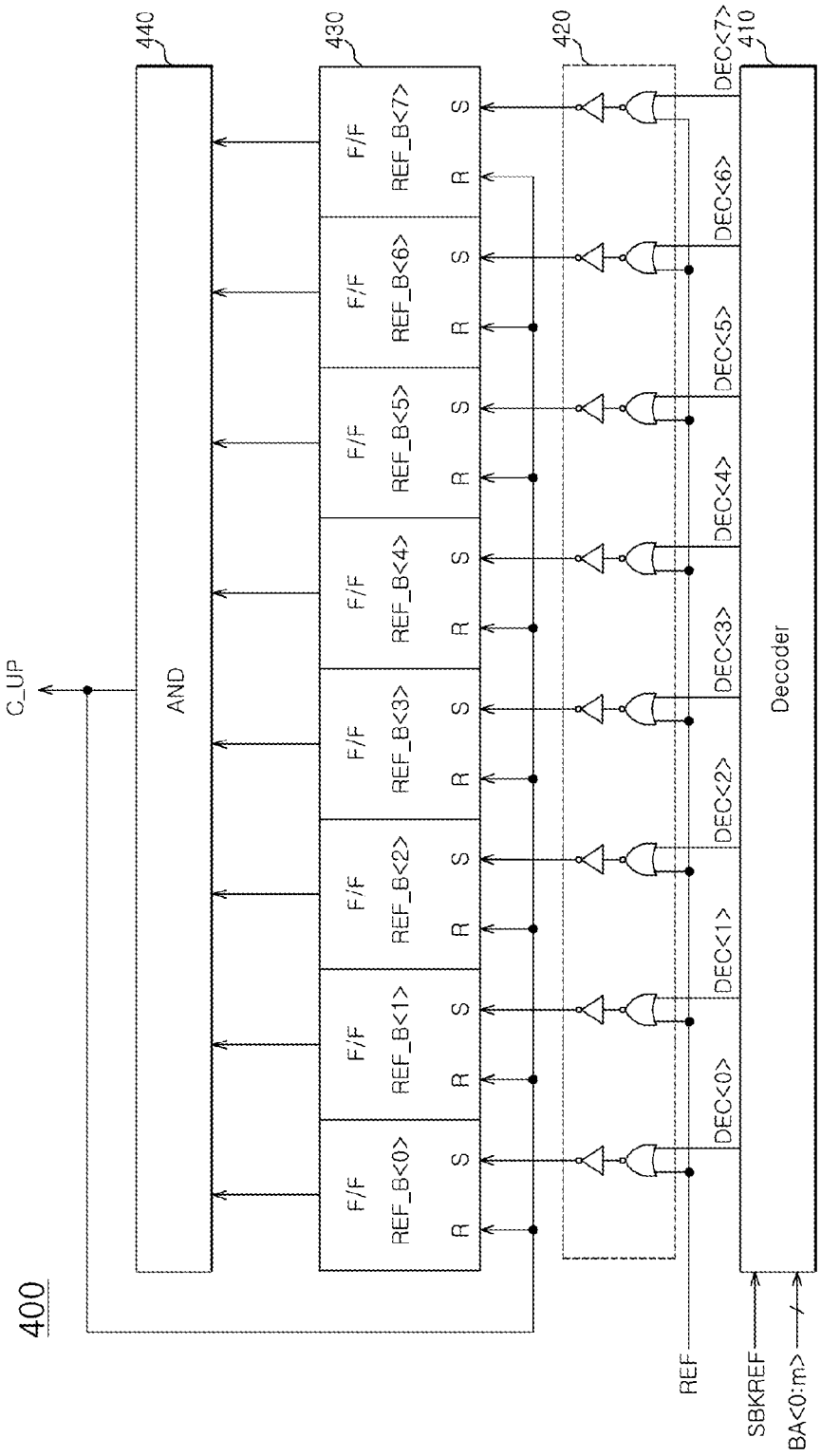
FIG. 2 is a block diagram showing the internal configuration of the refresh control block shown in FIG. 1.

Referring to FIG. 2, the refresh control block 400 may include a decoder 410, a storage control unit 420, a storage unit 430, and an AND logic 440.

The decoder 410 may be configured to decode the single bank refresh command SBKREF and the bank addresses BA<0:m>, and generate decoding signals DEC<0:7>.

The decoder 410 decodes the bank addresses BA<0:m> when the single bank refresh command SBKREF is inputted. The decoder 410 also activates corresponding decoding signals DEC<0:7>.

The storage control unit 420 may be configured to OR the decoding signals DEC<0:7> and the all bank refresh command REF, and output resultant signals.

The storage control unit 420 may include a plurality of NOR gates which receive the respective signal bits of the decoding signals DEC<0:7> and the all bank refresh command REF. The storage control unit 420 may also include a plurality of inverters which invert the respective outputs of the plurality of NOR gates.

The storage unit 430 may be configured to set refresh bank informations REF_B<0:7> in response to the output signals of the storage control unit 420.

The storage unit 430 may be configured to reset the refresh bank informations REF_B<0:7> according to the count control signal C_UP.

The storage unit 430 may include flip-flops F/F the number of which corresponds to the number of the signal bits of the refresh bank informations REF_B<0:7>.

The plurality of flip-flops F/F are inputted with the output signals of the storage control unit 420 through set terminals S thereof. The plurality of flip-flops F/F are commonly inputted with the count control signal C_UP through reset terminals R thereof.

The AND logic 440 may be configured to AND the refresh bank informations REF_B<0:7> of the storage unit 430, and output the count control signal C_UP.

The refresh operation of the semiconductor apparatus 100 in accordance with an embodiment, configured as mentioned above, will be described below.

For instance, it is assumed that the single bank refresh command SBKREF is provided from the memory controller outside the semiconductor apparatus 100 and the bank addresses BA<0:m> are provided such that the plurality of banks BK0 to BK7 may be sequentially designated.

If the single bank refresh command SBKREF and the bank addresses BA<0:m> to designate the bank BK0 are inputted, one of the decoding signals DEC<0:7>, for example, the decoding signal DEC<0> is outputted at an activated level, for example, a high level.

Since the decoding signal DEC<0> is the high level, the refresh bank information REF_B<0> of one of the plurality of flip-flops F/F of the storage unit 430 is set to a high level.

At this time, since the remaining refresh bank informations REF_B<1:n> are a low level, the count control signal C_UP is outputted at a deactivated level or a low level.

If all the bank addresses BA<0:m> to sequentially designate the plurality of banks BK0 to BK7 are inputted in normal order together with the single bank refresh command SBKREF, all the refresh bank informations REF_B<0:7> of the storage unit 430 become the high level.

Since all the refresh bank informations REF_B<0:7> are the high level, the count control signal C_UP is outputted at a high level.

As the count control signal C_UP is outputted at the high level, all the refresh bank informations REF_B<0:7> of the storage unit 430 are reset to the low level.

Since the count control signal C_UP is outputted at the high level, the counter 300 increases the address count value ADD_CNT.

It may be assumed that bank addresses BA<0:m> to designate a certain bank, among the bank addresses BA<0:m> to sequentially designate the plurality of banks BK0 to BK7, are missed or are erroneously inputted.

The memory controller may normally provide the bank addresses BA<0:m> and determine that refresh operations corresponding to the internal row addresses RAi generated by the counter 300 for all of the plurality of banks BK0 to BK7 are completed.

However, due to the missing of the bank addresses BA<0:m> to designate the certain bank, a refresh operation corresponding to the internal row addresses RAi of the certain bank has not been performed.

Since the bank addresses BA<0:m> to designate the certain bank are missed, any one of the refresh bank informations REF_B<0:7> of the storage unit 430 is retained at the low level.

Since any one of the refresh bank informations REF_B<0:7> is the low level, the count control signal C_UP is outputted at the low level.

Since the count control signal C_UP is outputted at the low level, the counter 300 does not increase the address count value ADD_CNT. The counter 300 also retains the current value of the address count value ADD_CNT.

Thereafter, as the bank addresses BA<0:m> to designate the bank having not been designated are inputted together with the single bank refresh command SBKREF, all the refresh bank informations REF_B<0:7> become the high level. Accordingly, the count control signal C_UP is outputted at the high level.

Since the count control signal C_UP is outputted at the high level, the counter 300 increases the address count value ADD_CNT.

If the all bank refresh command REF is inputted, all the refresh bank informations REF_B<0:7> become the high level regardless of the bank addresses BA<0:m>, and accordingly, the count control signal C_UP is outputted at the high level.

Since the count control signal C_UP is outputted at the high level, the counter 300 increases the address count value ADD_CNT.

Figure 3:
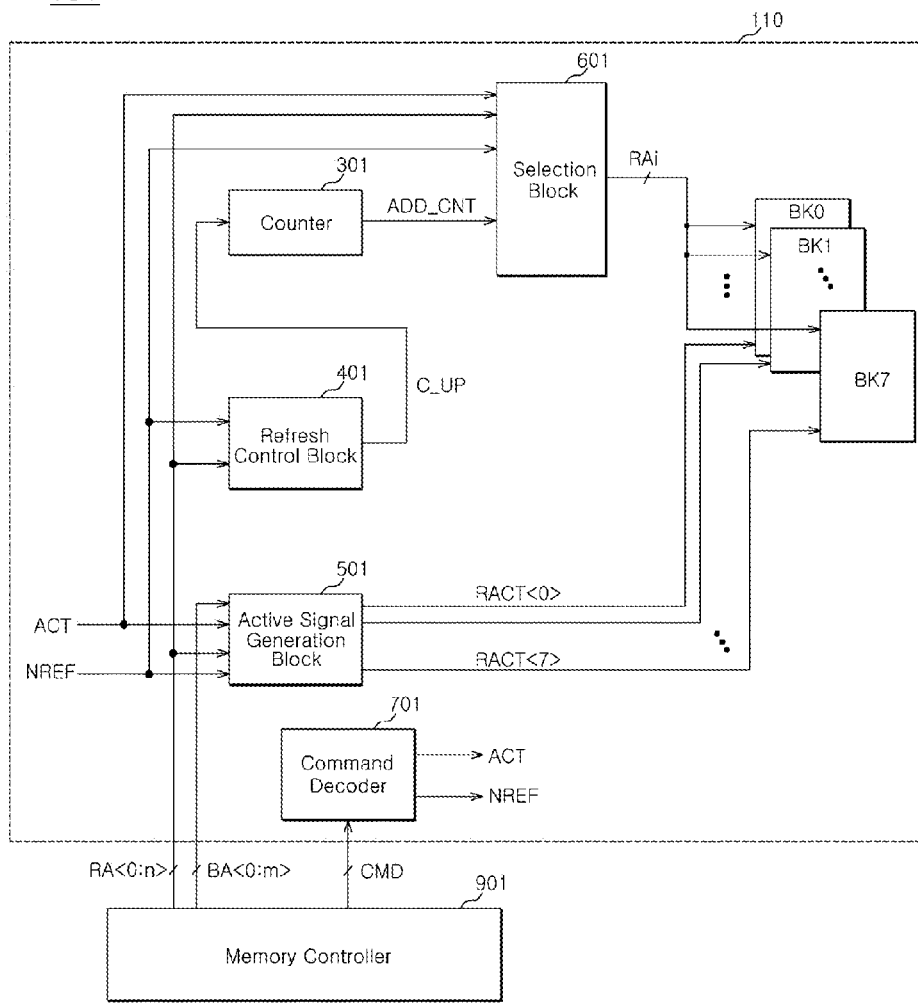
FIG. 3 is a block diagram of a memory system in accordance with an embodiment.

Referring to FIG. 3, a memory system 101 may include a semiconductor apparatus 110, and a memory controller 901.

The memory controller 901 may be configured to provide commands CMD, row addresses RA<0:n> and bank addresses BA<0:m> to the semiconductor apparatus 110.

In a normal operation, the memory controller 901 may be configured to provide the row addresses RA<0:n> as addresses to designate a specific word line and the bank addresses BA<0:m> as addresses to designate a specific bank among a plurality of banks BK0 to BK7, to the semiconductor apparatus 110.

In a refresh operation, the memory controller 901 may be configured to provide not the bank addresses BA<0:m> but the row addresses RA<0:n> as addresses to define a bank to refresh.

Although the row addresses RA<0:n> are addresses to select a word line, in the refresh operation, the row addresses RA<0:n> are not used to select a word line, but internally counted addresses are used.

Since the row addresses RA<0:n> are not necessary in the refresh operation, the memory controller 901 may map the information of a bank to refresh, in the row addresses RA<0:n>, and may then provide the row addresses RA<0:n> to the semiconductor apparatus 110.

The semiconductor apparatus 110 may include a plurality of banks BK0 to BK7, a counter 301, a refresh control block 401, an active signal generation block 501, a selection block 601, and a command decoder 701.

The plurality of banks BK0 to BK7 may be configured to perform a refresh operation for the memory cells electrically coupled with a specified word line of a selected bank BKi (i is one of 0 to n), in response to row active signals RACT<0:7> and internal row addresses RAi.

In the plurality of banks BK0 to BK7, a specified word line may be selected among entire word lines in response to the internal row addresses RAi.

In the plurality of banks BK0 to BK7, a specified word line or specified word lines of one, a plurality of or all of the banks BK0 to BK7 that correspond to a signal bit or signal bits activated among the row active signals RACT<0:7> may be activated.

The counter 301 may be configured to increase an internal address count value ADD_CNT in response to a count control signal C_UP.

The refresh control block 401 may be configured to detect that designation of the refresh operation for when all of the plurality of banks BK0 to BK7 is completed, in response to a refresh command NREF and the row addresses RA<0:n>. The refresh control block 401 may also activate the count control signal C_UP.

The refresh command NREF may be used as a new type refresh command for freely refreshing the plurality of banks BK0 to BK7, regardless of the number and order of banks to refresh, unlike the single bank refresh command SBKREF to refresh any one bank of the plurality of banks BK0 to BK7 or the all bank refresh command REF to refresh all of the plurality of banks BK0 to BK7.

The refresh control block 401 may be configured to store the informations of banks completely refreshed among the plurality of banks BK0 to BK7, in response to the refresh command NREF and the row addresses RA<0:n>. The refresh control block 401 may also detect that designation of the refresh operation for all of the plurality of banks BK0 to BK7 is completed, based on stored informations. The refresh control block 401 may also activate the count control signal C_UP.

The row addresses RA<0:n> provided in the refresh operation are mapped with the information of a bank to refresh.

Therefore, the refresh control block 401 may store the information of banks having completely been refreshed among the plurality of banks BK0 to BK7, in response to the row addresses RA<0:n>.

The active signal generation block 501 may be configured to generate the row active signals RACT<0:7> according to an active command ACT, the refresh command NREF, the row addresses RA<0:n> and the bank addresses BA<0:m>.

The active signal generation block 501 may be configured to generate the row active signals RACT<0:7> to activate a bank corresponding to the bank addresses BA<0:m>, when the active command ACT is inputted.

The active signal generation block 501 may be configured to generate the row active signals RACT<0:7> to activate a bank corresponding to the row addresses RA<0:n> mapped with the information of a bank to refresh, when the refresh command NREF is inputted.

For example, if the active command ACT is inputted and the bank addresses BA<0:m> have values to designate the bank BK0, the active signal generation block 501 may output only the row active signal RACT<0> among the row active signals RACT<0:7>, to a logic high.

If the refresh command NREF is inputted and the row addresses RA<0:n> have values to designate one bank BK2 among the plurality of banks BK0 to BK7, the active signal generation block 501 may output only the row active signal RACT<2> among the row active signals RACT<0:7>, to the logic high.

If the refresh command NREF is inputted and the row addresses RA<0:n> have values to designate partial banks BK0, BK2 and BK5 among the plurality of banks BK0 to BK7, the active signal generation block 501 may output the row active signals RACT<0,2,5> among the row active signals RACT<0:7>, to the logic high.

If the refresh command NREF is inputted and the row addresses RA<0:n> have values to designate all of the plurality of banks BK0 to BK7, the active signal generation block 501 may output all the row active signals RACT<0:7> to the logic high.

The selection block 601 may be configured to select the address count value ADD_CNT in response to the refresh command NREF. The selection block 601 may also output the internal row addresses RAi.

The selection block 601 may be configured to select row addresses RA<0:n> according to the active command ACT, and output the internal row addresses RAi.

The command decoder 701 may be configured to decode the commands CMD provided from the memory controller 901. The command decoder 701 may also generate the active command ACT and the refresh command NREF.

Figure 4:
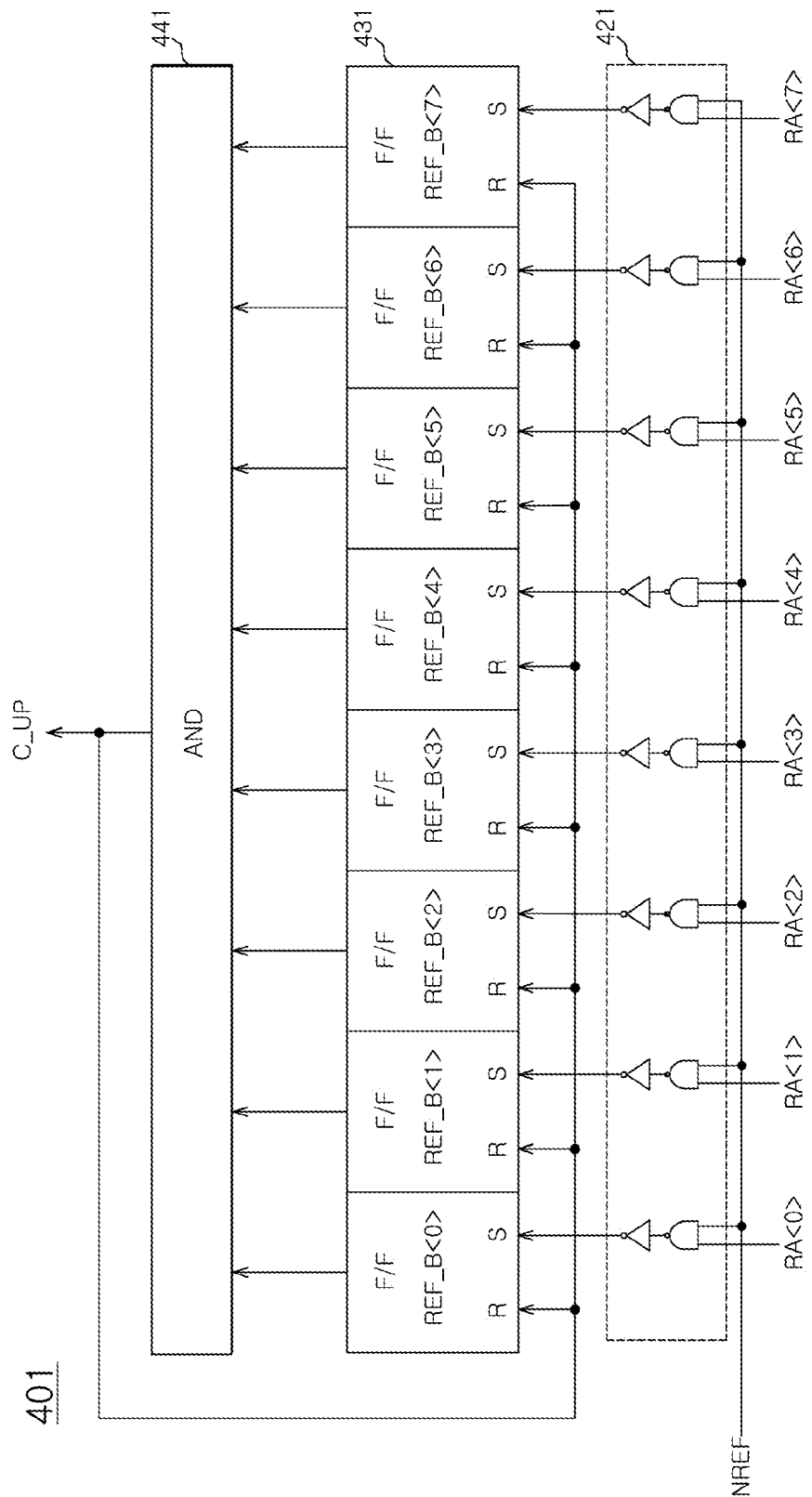
FIG. 4 is a row address mapping table according to FIG. 3.

Referring to FIG. 4, a bank to refresh may be mapped for the n+1 number of respective signal bits of the row addresses RA<0:n>.

For example, a bank to refresh among the plurality of banks BK0 to BK7, may be mapped using the row addresses RA<0:7> among the row addresses RA<0:n>.

If only the row address RA<0> among the row addresses RA<0:n> is set to a high level, it is possible to designate the bank BK0 among the plurality of banks BK0 to BK7, to be refreshed.

If the row addresses RA<0:5> among the row addresses RA<0:n> are set to the high level, it is possible to designate the banks BK0 to BK5 among the plurality of banks BK0 to BK7, to be refreshed.

If the row addresses RA<0,2,4> among the row addresses RA<0:n> are set to the high level, it is possible to designate the banks BK0, BK2 and BK4 to be refreshed.

If all the row addresses RA<0:7> among the row addresses RA<0:n> are set to the high level or a low level, it is possible to designate all of the plurality of banks BK0 to BK7 to be refreshed.

As can be readily seen, in the refresh operation, it is possible to freely designate the plurality of banks BK0 to BK7 to be refreshed, regardless of the number and order of banks to refresh, by using the row addresses RA<0:n>.

By defining a rule between the memory controller 901 and the semiconductor apparatus 110, the semiconductor apparatus 110 may recognize the row addresses RA<0:n> provided from the memory controller 901 in the refresh operation, as information to select a bank.

Referring to FIGS. 4 and 5, the refresh control block 401 may include a storage control unit 421, a storage unit 431, and an AND logic 441.

The storage control unit 421 may be configured to AND the refresh command NREF and the row addresses RA<0:7>, and output resultant signals.

The storage control unit 421 may include a plurality of NAND gates which receive the respective signal bits of the row addresses RA<0:7> and the refresh command NREF. The storage control unit 421 may also include a plurality of inverters which invert the respective outputs of the plurality of NAND gates.

The storage unit 431 may be configured to set refresh bank informations REF_B<0:7> in response to the output signals of the storage control unit 421.

The storage unit 431 may be configured to reset the refresh bank informations REF_B<0:7> in response to the count control signal C_UP.

The storage unit 431 may include flip-flops F/F the number of which corresponds to the number of the signal bits of the refresh bank informations REF_B<0:7>.

The plurality of flip-flops F/F are inputted with the output signals of the storage control unit 421 through set terminals S thereof. The plurality of flip-flops F/F are commonly inputted with the count control signal C_UP through reset terminals R thereof.

The AND logic 441 may be configured to AND the refresh bank informations REF_B<0:7> of the storage unit 431, and output the count control signal C_UP.

The refresh operation of the memory system 101 configured as mentioned above, will be described below.

From the memory controller 901, the refresh command NREF is provided, and the row addresses RA<0:7> to designate one, a part or all of the plurality of banks BK0 to BK7 are provided.

In the case where the row addresses RA<0:7> to designate one bank are inputted according to each refresh command NREF, all the refresh bank informations REF_B<0:7> may be stored at a high level by the refresh operations of 8 times.

When all the refresh bank informations REF_B<0:7> are the high level, the count control signal C_UP is outputted at an activated level, that is, a high level.

As the count control signal C_UP is outputted at the high level, all the refresh bank informations REF_B<0:7> of the storage unit 431 are reset to a low level.

Since the count control signal C_UP is outputted at the high level, the counter 301 increases the address count value ADD_CNT.

It may be assumed that one or a part of the row addresses RA<0:7> to designate one, a part or all of the plurality of banks BK0 to BK7 according to the refresh command NREF is missed or is erroneously inputted.

The memory controller 901 may normally provide the row addresses RA<0:7> and determine that refresh operations corresponding to the internal row addresses RAi generated by the counter 301 for all of the plurality of banks BK0 to BK7 are completed.

However, due to the erroneous input of the row addresses RA<0:7> to designate one or a part of the banks BK0 to BK7, the refresh operation has not been performed for the internal row addresses RAi of a corresponding bank or corresponding banks.

Since the row addresses RA<0:7> to designate one or a part of the banks BK0 to BK7 are erroneously inputted, any one or a part of the refresh bank informations REF_B<0:7> of the storage unit 431 is retained at the low level.

Since any one or a part of the refresh bank informations REF_B<0:7> is the low level, the count control signal C_UP is outputted at a low level. In addition, the counter 301 does not increase the address count value ADD_CNT and retains the current value of the address count value ADD_CNT.

Thereafter, as the row addresses RA<0:7> to designate one or a part of the banks BK0 to BK7 are inputted together with the refresh command NREF, when all the refresh bank informations REF_B<0:7> become the high level, the count control signal C_UP is outputted at the high level.

Since the count control signal C_UP is outputted at the high level, the counter 301 increases the address count value ADD_CNT.

In an embodiment described above, the refresh operation may be performed through freely designating one, a part or all of the plurality of banks BK0 to BK7, by using the row addresses RA<0:7> mapped with the information of at least one bank to refresh.

The plurality of banks BK0 to BK7 may be designated in such a manner that one bank is repeatedly selected in respective refresh operations as in banks BK0+BK1, banks BK1+BK2, ... and banks BK6+BK7.

The plurality of banks BK0 to BK7 may be designated in such a manner that two banks are repeatedly selected in respective refresh operations as in banks BK0+BK1+BK2, banks BK1+BK2+BK3, ... and banks BK5+BK6+BK7.

The plurality of banks BK0 to BK7 may be designated in such a manner that refresh operations are sequentially performed for even-numbered banks BK0, BK2, ... and BK6 and then refresh operations are sequentially performed for odd-numbered banks BK1, BK3, ... and BK7.

The plurality of banks BK0 to BK7 may be designated in such a manner that refresh operations are alternately performed for two even-numbered banks and then two odd-numbered banks as in banks BK0+BK2, banks BK1+BK3, banks BK4+BK6 and banks BK5+BK7.

Besides the above examples, the plurality of banks BK0 to BK7 may be selected in a variety of ways, and then refresh operations may be performed.

Figure 6:
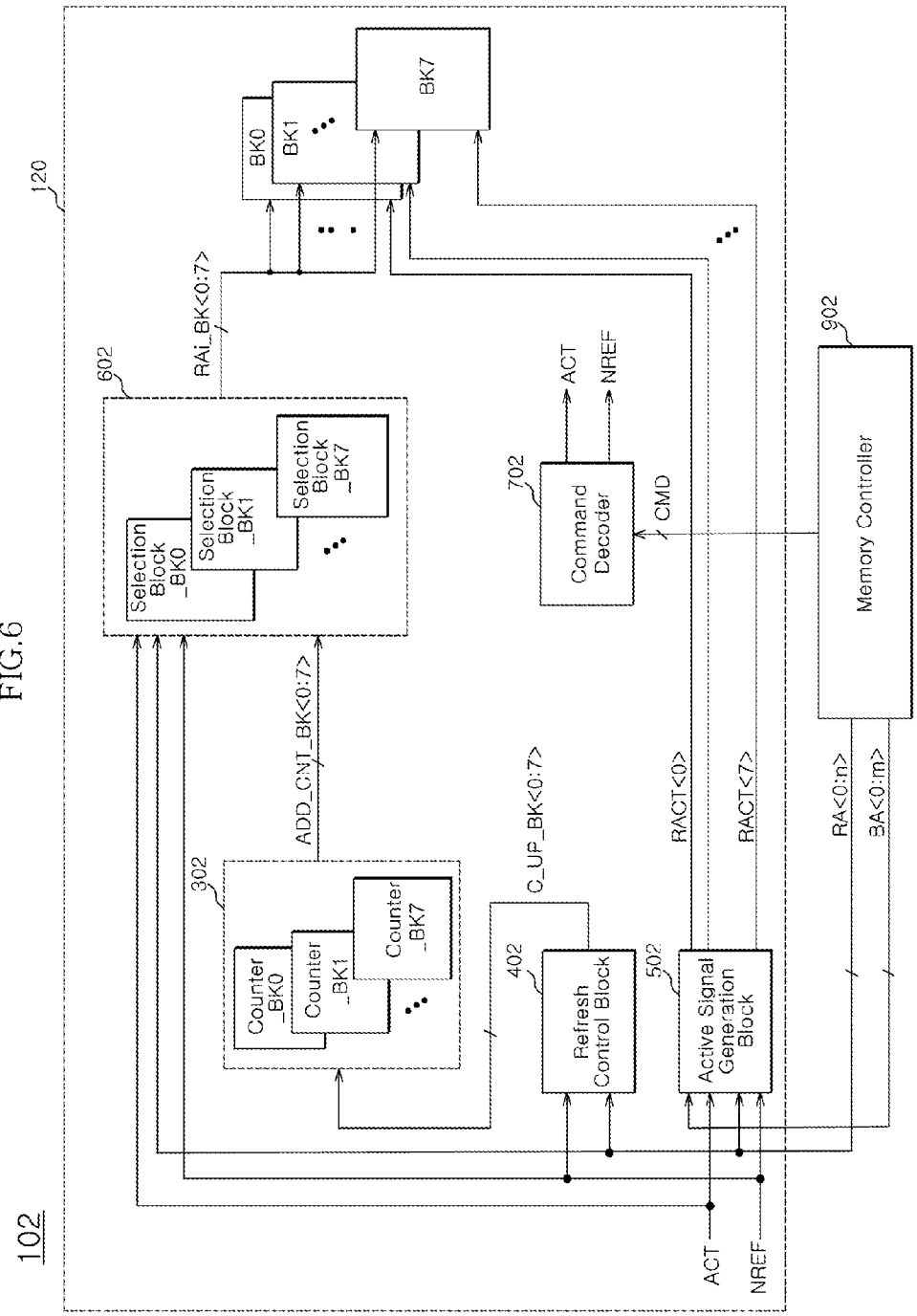
FIG. 6 is a block diagram of a memory system in accordance with an embodiment.

Referring to FIG. 6, a memory system 102 may include a semiconductor apparatus 120, and a memory controller 902.

The memory controller 902 may be configured to provide commands CMD, row addresses RA<0:n> and bank addresses BA<0:m> to the semiconductor apparatus 120.

In a normal operation, the memory controller 902 may be configured to provide the row addresses RA<0:n> as addresses to designate a specific word line and the bank addresses BA<0:m> as addresses to designate a specific bank among a plurality of banks BK0 to BK7, to the semiconductor apparatus 120.

In a refresh operation, the memory controller 902 may be configured to provide not the bank addresses BA<0:m> but the row addresses RA<0:n> as addresses to define a bank to refresh.

The memory controller 902 may map the information of a bank to refresh, in the row addresses RA<0:n>, and may then provide the row addresses RA<0:n> to the semiconductor apparatus 120 (see FIG. 4).

The semiconductor apparatus 120 may include a plurality of banks BK0 to BK7, a plurality of counters 302, a refresh control block 402, an active signal generation block 502, a plurality of selection blocks 602, and a command decoder 702.

The plurality of banks BK0 to BK7 may be configured to perform independent refresh operations in response to row active signals RACT<0:7> and internal row addresses RAi_BK<0:7> for banks.

The internal row addresses RAi_BK<0:7> for banks may be one-to-one allocated to the plurality of banks BK0 to BK7.

More specifically, the internal row address RAi_BK<0> may be allocated to the bank BK0, RAi_BK<1> to BK1, RAi_BK<2> to BK2, ..., and RAi_BK<7> to BK7.

Among the plurality of banks BK0 to BK7, one, a plurality of or all of the banks BK0 to BK7, selected according to signal bits activated among the row active signals RACT<0:7>, may perform refresh operations for the memory cells electrically coupled with different word lines in response to the respective internal row addresses RAi_BK<0:7> for banks. In the case where the internal row addresses RAi_BK<0:7> for banks, provided to one, a plurality of or all of the banks BK0 to BK7 selected, have the same value, refresh operations may be performed for the memory cells electrically coupled with the same word lines.

The plurality of counters 302 may be configured to independently increase address count values ADD_CNT_BK<0:7> for banks, according to count control signals C_UP_BK<0:7> for banks, respectively.

The address count values ADD_CNT_BK<0:7> for banks may be independently stored in the plurality of counters 302.

In other words, the address count value ADD_CNT_BK<0> may be stored in a counter Counter_BK0, ADD_CNT_BK<1> in Counter_BK1, ADD_CNT_BK<2> in Counter_BK2, ..., and ADD_CNT_BK<7> in Counter_BK7.

The count control signals C_UP_BK<0:7> for banks may be one-to-one allocated to the plurality of counters 302.

In other words, the count control signal C_UP_BK<0> may be allocated to the counter Counter_BK0, C_UP_BK<1> to Counter_BK1, C_UP_BK<2> to Counter_BK2, ..., and C_UP_BK<7> to Counter_BK7.

The refresh control block 402 may be configured to independently activate the count control signals C_UP_BK<0:7> for banks according to a refresh command NREF and the respective signal bits of the row addresses RA<0:n>.

The refresh command NREF may be used as a new type refresh command for freely refreshing the plurality of banks BK0 to BK7, regardless of the number and order of banks to refresh, unlike the single bank refresh command SBKREF for refreshing any one bank of the plurality of banks BK0 to BK7 or the all bank refresh command REF for refreshing all of the plurality of banks BK0 to BK7.

The active signal generation block 502 may be configured to generate the row active signals RACT<0:7> according to an active command ACT, the refresh command NREF, the row addresses RA<0:n> and the bank addresses BA<0:m>.

The active signal generation block 502 may be configured to generate the row active signals RACT<0:7> to activate a bank corresponding to the bank addresses BA<0:m>, when the active command ACT is inputted.

The active signal generation block 502 may be configured to generate the row active signals RACT<0:7> to activate a bank corresponding to the row addresses RA<0:n> mapped with the information of a bank to refresh, when the refresh command NREF is inputted.

For example, if the active command ACT is inputted and the bank addresses BA<0:m> have values to designate the bank BK0, the active signal generation block 502 may output only the row active signal RACT<0> among the row active signals RACT<0:7>, to a logic high.

If the refresh command NREF is inputted and the row addresses RA<0:n> have values to designate one bank BK2, the active signal generation block 502 may output only the row active signal RACT<2> to the logic high.

If the refresh command NREF is inputted and the row addresses RA<0:n> have values to designate partial banks BK0, BK2 and BK5, the active signal generation block 502 may output the row active signals RACT<0,2,5> to the logic high.

If the refresh command NREF is inputted and the row addresses RA<0:n> have values to designate all of the plurality of banks BK0 to BK7, the active signal generation block 502 may output all the row active signals RACT<0:7> to the logic high.

The plurality of selection blocks 602 may be configured to select values corresponding to them among the address count values ADD_CNT_BK<0:7> for banks when the refresh command NREF is inputted, and output the internal row addresses RAi_BK<0:7> for banks.

Namely, the selection block Selection Block_BK0 may select the address count value ADD_CNT_BK<0> and output the internal row address RAi_BK<0>. The selection block Selection Block_BK1 may select the address count value ADD_CNT_BK<1> and output the internal row address RAi_BK<1>. In this way, the selection block Selection Block_BK7 may select the address count value ADD_CNT_BK<7> and output the internal row address RAi_BK<7>.

The plurality of selection blocks 602 may be configured to output the row addresses RA<0:n> as the internal row addresses RAi_BK<0:7> for banks, when the active command ACT is inputted.

If the active command ACT is inputted, the respective internal row addresses RAi_BK<0:7> for banks may have the the same values of the row addresses RA<0:n>.

The command decoder 702 may be configured to decode the commands CMD provided from the memory controller 902, and generate the active command ACT and the refresh command NREF.

Figure 7:
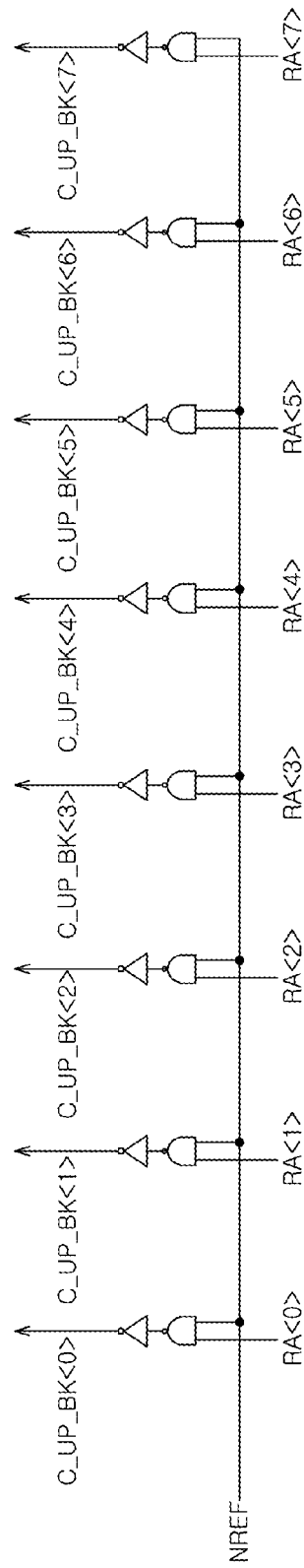
FIG. 7 is a circuit diagram of the refresh control block shown in FIG. 6.

Referring to FIG. 7, the refresh control block 402 may include a plurality of AND logics which AND the refresh command NREF and the respective signal bits of the row addresses RA<0:n> and output the count control signals C_UP_BK<0:7> for banks.

The plurality of AND logics may include a plurality of NAND gates and a plurality of inverters which invert the respective outputs of the plurality of NAND gates.

The refresh command NREF is inputted commonly to one input terminals of the two input terminals of the plurality of NAND gates. In addition, the signal bits of the row addresses RA<0:n> are respectively inputted to the other input terminals.

The refresh operation of the memory system 102 in accordance with an embodiment, configured as mentioned above, will be described below.

From the memory controller 902, the refresh command NREF is provided. In addition, the row addresses RA<0:7> for designating one, a part or all of the plurality of banks BK0 to BK7 are provided.

First, it is assumed that the row address RA<0> is provided at the high level, along with the refresh command NREF, to designate the bank BK0 among the plurality of banks BK0 to BK7.

Since the row address RA<0> among the row addresses RA<0:7> is a high level, the count control signal C_UP_BK<0> among the count control signals C_UP_BK<0:7> is outputted at a high level.

According to the count control signal C_UP_BK<0>, the counter Counter_BK0 increases the address count value ADD_CNT_BK<0>.

Since the refresh command NREF is inputted, the plurality of selection blocks 602 respectively select the address count values ADD_CNT_BK<0:7> for banks. In addition, the plurality of selection blocks 602 respectively output the internal row addresses RAi_BK<0:7> for banks.

The address count value ADD_CNT_BK<0> among the address count values ADD_CNT_BK<0:7> for banks is increased. Further, the remaining address count values ADD_CNT_BK<1:7> for banks retain previous values.

The refresh operation is performed for the memory cells electrically coupled with a word line corresponding to the increased address count value ADD_CNT_BK<0>, among the word lines of the bank BK0.

It is assumed that the row addresses RA<1:7> are sequentially provided at the high level along with the refresh command NREF with a predetermined time interval, to sequentially designate the remaining banks BK1 to BK7.

Since the row addresses RA<1> to RA<7> are sequentially outputted at the high level, the count control signals C_UP_BK<1> to C_UP_BK<7> are then sequentially outputted at the high level.

According to the count control signals C_UP_BK<1> to C_UP_BK<7> sequentially outputted at the high level, the counters Counter_BK1 to Counter_BK7 increase the address count values ADD_CNT_BK<1:7> for banks.

At this time, it is assumed that the row address RA<6> is missed in the course of providing the row addresses RA<1:7> to sequentially designate the remaining banks BK1 to BK7.

Since the row address RA<6> is missed, that is, the row address RA<6> does not transition to the high level, the count control signal C_UP_BK<6> also does not transition to the high level. Accordingly, the address count value ADD_CNT_BK<6> retains a previous state.

Therefore, even though the memory controller 902 does not recognize the missing of the row address RA<6> and refresh for a corresponding bank is not implemented, normal refresh of a word line corresponding to the address count value ADD_CNT_BK<6> may be possible in the next refresh operation.

In an example, it may be assumed that the row addresses RA<1:5> are provided at the high level along with the refresh command NREF, from the memory controller 902, to designate the banks BK1 to BK5 among the plurality of banks BK0 to BK7.

Since the row addresses RA<1:5> among the row addresses RA<0:7> are the high level, the count control signals C_UP_BK<1:5> among the count control signals C_UP_BK<0:7> are outputted at the high level.

According to the count control signals C_UP_BK<1:5>, the counters Counter_BK1 to Counter BK5 increase the address count values ADD_CNT_BK<1:5> for banks.

Since the refresh command NREF is inputted, the plurality of selection blocks 602 respectively select the address count values ADD_CNT_BK<0:7> for banks. In addition, the plurality of selection blocks 602 respectively output the internal row addresses RAi_BK<0:7> for banks.

The address count values ADD_CNT_BK<1:5> for banks among the address count values ADD_CNT_BK<0:7> for banks are increased. In addition, the remaining address count values ADD_CNT_BK<0,6,7> for banks retain previous values.

The refresh operations are performed for the memory cells electrically coupled with word lines corresponding to the increased address count values ADD_CNT_BK<1:5> for banks, among the word lines of the respective banks BK1 to BK5.

In an example, it is assumed that the row addresses RA<0:7> are provided at the high level along with the refresh command NREF, from the memory controller 902, to designate all the plurality of banks BK0 to BK7.

Since all the row addresses RA<0:7> are the high level, all the count control signals C_UP_BK<0:7> are outputted at the high level.

According to the count control signals C_UP_BK<0:7>, the counters Counter_BK0 to Counter_BK7 increase the address count values ADD_CNT_BK<0:7> for banks.

Since the refresh command NREF is inputted, the plurality of selection blocks 602 respectively select the address count values ADD_CNT_BK<0:7> for banks. The plurality of selection blocks 602 also respectively output the internal row addresses RAi_BK<0:7> for banks.

The refresh operations are performed for the memory cells electrically coupled with word lines corresponding to the increased address count values ADD_CNT_BK<0:7> for banks, among the word lines of the plurality of respective banks BK0 to BK7.

In an embodiment described above, the refresh operation may be performed through freely designating one, a part or all of the plurality of banks BK0 to BK7, by using the row addresses RA<0:7> mapped with the information of at least one bank to refresh.

The plurality of banks BK0 to BK7 may be designated in such a manner that one bank is repeatedly selected in respective refresh operations as in banks BK0+BK1, banks BK1+BK2, . . . and banks BK6+BK7.

The plurality of banks BK0 to BK7 may be designated in such a manner that two banks are repeatedly selected in respective refresh operations as in banks BK0+BK1+BK2, banks BK1+BK2+BK3, . . . and banks BK5+BK6+BK7.

The plurality of banks BK0 to BK7 may be designated in such a manner that refresh operations are sequentially performed for even-numbered banks BK0, BK2, . . . and BK6 and then refresh operations are sequentially performed for odd-numbered banks BK1, BK3, . . . and BK7.

The plurality of banks BK0 to BK7 may be designated so that refresh operations are alternately performed for two even-numbered banks and then two odd-numbered banks as in banks BK0+BK2, banks BK1+BK3, banks BK4+BK6 and banks BK5+BK7.

In addition to the above examples, the plurality of banks BK0 to BK7 may be selected in a variety of ways, and then refresh operations may be performed.

While various embodiments have been described, it will be understood to those skilled in the art that the embodiments described are by way of example only. Accordingly, the semiconductor apparatus capable of preventing a refresh error and the memory system using the same described herein should not be limited based on the described embodiments.

What is claimed is:

1. A semiconductor apparatus comprising:
   a plurality of memory banks configured to perform a refresh operation based on an address count value and row active signals;
   a refresh control block configured to update refresh bank informations, each of which indicate a memory bank designated to perform the refresh operation, based on a refresh command and bank addresses, and activate a count control signal based on the refresh bank informations indicating that designation of the refresh operation for the plurality of memory banks is completed; and
   a counter configured to change the address count value based on activation of the count control signal.

2. The semiconductor apparatus according to claim 1, wherein the refresh command comprises a single bank refresh command for refreshing one of the plurality of memory banks or an all bank refresh command for refreshing all of the plurality of memory banks.

3. The semiconductor apparatus according to claim 2, wherein the refresh control block is configured to activate the count control signal independent from the bank addresses when the all bank refresh command is inputted.

4. The semiconductor apparatus according to claim 1, wherein the refresh control block is configured to reset the refresh bank informations based on the activation of the count control signal.

5. The semiconductor apparatus according to claim 1, wherein the refresh control block comprises:
   a decoder configured to decode a single bank refresh command and the bank addresses, and generate decoding signals based on the decoded single bank refresh command and the bank addresses;
   a storage control unit configured to combine the decoding signals and an all bank refresh command, and produce output signals based on the combined decoding signals and all bank refresh command;
   a storage unit configured to set the refresh bank informations based on the output signals of the storage control unit; and
   an AND logic circuit configured to perform an AND operation on the refresh bank informations, and activate the count control signal based on the AND operation.

6. The semiconductor apparatus according to claim 5, wherein the storage unit is configured to reset the refresh bank informations based on the activation of the count control signal.

7. The semiconductor apparatus according to claim 1, wherein the address count value is a value to select a specified word line of the plurality of memory banks.

8. The semiconductor apparatus according to claim 1, wherein, in a normal operation, any one memory bank among the plurality of memory banks is selected by the bank addresses, and a word line of the selected memory bank is selected by the row addresses.

9. A memory system comprising:
   a memory controller configured to, for a refresh operation, provide the row addresses as information which designates a specified memory bank among the plurality of memory banks to refresh, and provide a refresh command along with the row addresses; and
   a semiconductor apparatus configured to perform the refresh operation for at least one memory bank which corresponds to the row addresses and is designated to perform the refresh operation based on the refresh command.

10. The memory system according to claim 9, wherein the memory controller is configured to, for a normal operation, provide bank addresses as addresses to designate a specified memory bank among a plurality of memory banks and provide the row addresses as addresses to designate a specified word line of the specified memory bank, to the semiconductor apparatus.

11. The memory system according to claim 9, wherein the memory controller has a one-to-one mapping between the memory banks to refresh and the row addresses.

12. The memory system according to claim 11, wherein a plurality of memory banks to refresh are designated by setting the signal bits of the row addresses selectively to a first level.

13. The memory system according to claim 11, wherein all of a plurality of memory banks are designated to be refreshed, by setting the signal bits of the row addresses to a first level or a second level.

14. A memory system comprising:
   a memory controller configured to provide row addresses as information which designates a specified memory bank among a plurality of memory banks to refresh, and provide a refresh command along with the row addresses; and
   a semiconductor apparatus configured to perform a refresh operation for at least one memory bank which is designated according to the row addresses to perform the refresh operation based on the refresh command, and change an address count value for designating a specified word line of the designated memory bank to be refreshed when refresh designation for the plurality of memory banks is completed.

15. The memory system according to claim 14, wherein the memory controller is configured to, in a normal operation, provide bank addresses as addresses to designate a specified memory bank among the plurality of memory banks and provide the row addresses as addresses to designate a specified word line of the specified memory bank, to the semiconductor apparatus.

16. The memory system according to claim 14, wherein the memory controller has a one-to-one mapping between the memory banks to refresh and the row addresses.

17. The memory system according to claim 14, wherein the semiconductor apparatus comprises:
the plurality of memory banks configured to perform the refresh operation based on the address count value and row active signals;
a refresh control block configured to update refresh bank informations, each of which indicate at least one memory bank designated to perform the refresh operation, based on the refresh command and the row addresses, and activate a count control signal based on the refresh bank informations indicating that designation of the refresh operation for the plurality of memory banks is completed; and
a counter configured to change the address count value based on the activation of the count control signal.

18. The memory system according to claim 17, wherein the refresh control block is configured to reset the refresh bank informations based on the activation of the count control signal.

19. The memory system according to claim 17, wherein the refresh control block comprises:
a storage control unit configured to perform an AND operation on the refresh command and the row addresses, and produce output signals based on the AND operation of the refresh command and the row addresses;
a storage unit configured to set the refresh bank informations based on the output signals of the storage control unit; and
an AND logic circuit configured to perform an AND operation on the refresh bank informations, and activate the count control signal based on the AND operation on the refresh bank informations.

20. The memory system according to claim 19, wherein the storage unit is configured to reset the refresh bank informations based on the activation of the count control signal.

21. The memory system according to claim 14, wherein the address count value is a value to select a specified word line of the plurality of memory banks.

22. A memory system comprising:
a memory controller configured to provide row addresses as information which designates a specified memory bank among a plurality of memory banks to refresh, and provide a refresh command along with the row addresses; and
a semiconductor apparatus configured to perform a refresh operation for one or more memory banks designated according to the row addresses to perform the refresh operation, based on the refresh command, and to independently increase address count values for memory banks and perform the refresh operation for word lines corresponding to the address count values for memory banks.

23. The memory system according to claim 22, wherein the memory controller is configured to, in a normal operation, provide bank addresses as addresses to designate a specified memory bank among the plurality of memory banks and provide the row addresses as addresses to designate a specified word line of the specified memory bank, to the semiconductor apparatus.

24. The memory system according to claim 22, wherein the semiconductor apparatus has a one-to-one mapping between the memory banks to refresh and the row addresses.

25. The memory system according to claim 22, wherein the semiconductor apparatus comprises:
the plurality of memory banks configured to perform the refresh operation based on the address count values for memory banks and row active signals;
a refresh control block configured to independently activate count control signals for memory banks based on the refresh command and the respective signal bits of the row addresses; and
a plurality of counters configured to independently increase the address count values for memory banks based on the count control signals for memory banks, respectively.

26. A method for use in refreshing a plurality of memory banks, the method comprising:
setting a refresh bank information for each memory bank designated to perform a refresh operation;
activating a count control signal when the refresh bank informations for the plurality of memory banks is set; and
changing, based on the activation of the count control signal, an address count value which is utilized to select a specified word line of a memory bank designated to perform the refresh operation.

27. The method of claim 26, wherein the refresh operation is performed for a memory bank that is selected by a row address.

28. The method of claim 26, wherein changing the address count value comprises increasing the address count value.

29. The method of claim 26, further comprising:
resetting the refresh bank informations based on the activation of the count control signal.

30. The method of claim 26, wherein each refresh bank information comprises a stored bit value.

31. A method for use in refreshing a plurality of memory banks, the method comprising:
for a normal operation, providing bank addresses as addresses to designate a specified memory bank among the plurality of memory banks, and row addresses as addresses to designate a specified word line of the specified memory bank; and
for a refresh operation, provide the row addresses as information to designate a specified memory bank among the plurality of memory banks to refresh.

32. The method of claim 30, further comprising:
performing the refresh operation for at least one memory bank corresponding to the row addresses based on a refresh command.

33. The method of claim 30, further comprising:
providing a one-to-one mapping between the memory banks and the row addresses.

* * * * *